United States Patent
De Coi

(10) Patent No.: US 10,148,892 B2
(45) Date of Patent: Dec. 4, 2018

(54) HDR PIXEL

(71) Applicant: ESPROS Photonics AG, Sargans (CH)

(72) Inventor: Beat De Coi, Maienfeld (CH)

(73) Assignee: ESPROS Photonics AG, Sargans (CH)

( * ) Notice: Subject to any disclaimer, the term of this patent is extended or adjusted under 35 U.S.C. 154(b) by 0 days.

(21) Appl. No.: 15/433,222

(22) Filed: Feb. 15, 2017

(65) Prior Publication Data

US 2017/0237891 A1 Aug. 17, 2017

(30) Foreign Application Priority Data

Feb. 16, 2016 (EP) .................................... 16156012

(51) Int. Cl.
| | |
|---|---|
| *H04N 5/235* | (2006.01) |
| *H01L 27/146* | (2006.01) |
| *H04N 5/265* | (2006.01) |
| *H04N 5/376* | (2011.01) |
| *H04N 5/378* | (2011.01) |
| *H04N 5/76* | (2006.01) |

(52) U.S. Cl.
CPC ..... *H04N 5/2355* (2013.01); *H01L 27/14603* (2013.01); *H01L 27/14607* (2013.01); *H01L 27/14609* (2013.01); *H04N 5/265* (2013.01); *H04N 5/378* (2013.01); *H04N 5/3765* (2013.01); *H04N 5/76* (2013.01)

(58) Field of Classification Search
CPC ...... H04N 5/2355; H04N 5/76; H04N 5/3765; H04N 5/265; H04N 5/378; H01L 27/14609; H01L 27/14603; H01L 27/14607
See application file for complete search history.

(56) References Cited

U.S. PATENT DOCUMENTS 9,200,952 B2 * 12/2015 Kozuma ................... G01J 1/44
2009/0134396 A1 * 5/2009 Kawahito ............... G01S 17/10
257/72

(Continued)

FOREIGN PATENT DOCUMENTS

| EP | 2 743 724 A1 | 6/2014 |
| EP | 2 978 216 A1 | 1/2016 |

OTHER PUBLICATIONS

Extended European Search Report (Application No. 16156012.3) dated Jul. 29, 2016.

(Continued)

*Primary Examiner* — Jason A Flohre
(74) *Attorney, Agent, or Firm* — Burr & Brown, PLLC

(57) ABSTRACT

The image sensor according to the invention is an image sensor with a matrix of pixels for generating a resulting image with a higher dynamic range from the acquisition of two original images, wherein the pixels of the image sensor are designed as demodulation pixels, wherein each comprises a conversion region for generating charge carriers from the received radiation, a separation device for temporally separating the generated charge carriers into two charge carrier streams, a memory device with two memories for separately storing the charge carriers of the two charge carrier streams, and a read-out device for converting the stored charge carriers into electrical signals, wherein the separation device is designed to carry out the separation of the charge carriers generated in one period into two different time periods.

11 Claims, 1 Drawing Sheet

(56) References Cited

U.S. PATENT DOCUMENTS

| | | | |
|---|---|---|---|
| 2009/0224139 A1 | 9/2009 | Buettgen et al. | |
| 2010/0187401 A1* | 7/2010 | Kawahito | H01L 27/14609 250/208.1 |
| 2010/0259570 A1 | 10/2010 | Omi et al. | |
| 2012/0002089 A1* | 1/2012 | Wang | H01L 27/14603 348/297 |
| 2012/0168609 A1* | 7/2012 | Krymski | H01L 27/14607 250/208.1 |
| 2013/0135486 A1* | 5/2013 | Wan | H04N 5/765 348/207.99 |
| 2014/0145281 A1 | 5/2014 | Bever et al. | |
| 2014/0160459 A1* | 6/2014 | Huber | G01S 7/4865 356/5.01 |
| 2014/0285707 A1 | 9/2014 | Ogawa | |

OTHER PUBLICATIONS

Extended European Search Report (Application No. 16156012.3) dated Oct. 7, 2016.

\* cited by examiner

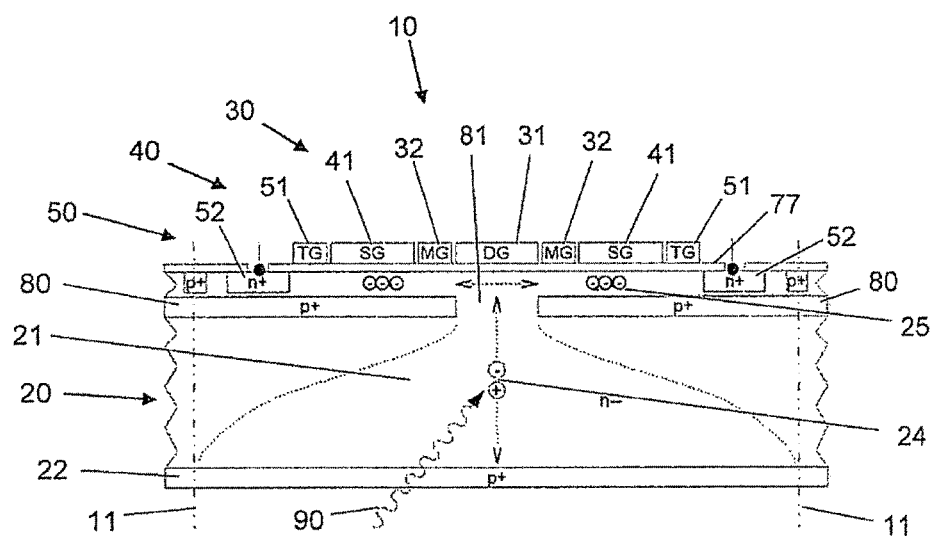

HDR PIXEL

This application claims the benefit under 35 USC § 119(a)-(d) of European Application No. 16156012.3 filed Feb. 16, 2016, the entirety of which is incorporated herein by reference.

FIELD OF THE INVENTION

The invention relates to an image sensor with a matrix of pixels for producing a resulting image with a higher dynamic range from the acquisition of at least two original images.

BACKGROUND OF THE INVENTION

Image sensors of the type mentioned above which acquire two individual images and then combine the images to form an image with a higher dynamic range by means of image processing are known from the prior art.

SUMMARY OF THE INVENTION

It is an object of the present invention to provide an improved image sensor of the type mentioned.

The image sensor according to the present invention is an image sensor with a matrix of pixels for generating a resulting image with a higher dynamic range from the acquisition of two source images, wherein the pixels of the image sensor are designed as demodulation pixels, each of which comprises a conversion region for generation of charge carriers from the received radiation, a separation device for the temporal separation of the generated charge carriers into two charge carrier streams, a memory device with two memories for the separate storage of the charge carriers of the two charge carrier streams, and a readout device for converting the stored charge carriers into electrical signals, wherein the separation device is designed to separate the charge carriers generated in one period into charge carriers in two different time periods.

The two filled pixel memories correspond to the two original images.

The two memories thus acquire charge carriers with generation times of different length, which correspond to different exposure times for the two source images.

A demodulaton pixel is described, for example, in applicant's international patent application PCT/EP2016/051296.

This can have the advantage that both source images are present at the same time in the region of the sensor and may therefore be processed better.

Preferably, the separation device arranges the two time intervals successively. This can have the advantage that the charging currents may flow optimally and an exposure is completed particularly quickly.

Preferably, the separation device respectively arranges the two time intervals alternately in a dovetailing manner. This can have the advantage that the production of the two original images takes place practically without any time offset and thus without time artifacts.

Preferably, the separation device performs the separation periodically. This can have the advantage that the image sensor is simplified and may be frequency-modulated.

In particular, a periodic modulation with a duty factor of not more than 50% may be effected, in particular, with a duty factor of 10% and 90%, which corresponds approximately to a 9-times longer exposure of the one memory and thus of the one original image.

Preferably, the image sensor comprises a selection device to select one of the two memories or one value of the two memories depending on the degree of saturation of one of the memories or both memories, in order to calculate a value for a pixel point in the resulting image. This can have the advantage that the memory is selected which allows a more dynamic range to be displayed.

Preferably, the selection device has an analog comparator per pixel or per row of pixels, which performs the selection analogously before an AD conversion. This can have the advantage that the selection of the value to be used is performed before the AD conversion and thus the data rate to the AD converter remains low and the image frequency may be increased.

Preferably, the analog comparator comprises an adjustable comparator threshold as a function of which the selection is performed. This can have the advantage that the dynamic range may be influenced and thus optimized.

Preferably, the pixel of the image sensor is constructed as a 2-tap demodulation pixel as it is known in the area of time-of-flight (TOF) 3D distance imaging.

Preferably, the conversion region comprises a doped substrate, in particular an n-type doped semiconductor substrate, and/or an electrode for depletion of the substrate, in particular, a transparent back electrode on the underside of the substrate.

Preferably, the separation device has a driftgate on the upper side of the substrate to attract the charge carriers from the conversion region in the separation device. The driftgate may also be formed by the modulation gates described below.

Preferably, the separation device comprises two modulation gates on the upper side of the substrate, in particular, at locations opposite the driftgate, for alternately steering and separating the charge carriers.

Preferably, the memory device has two storage gates on the upper side of the substrate, wherein each is assigned to a modulation gate and serves for the collection and storage of the charge carriers directed towards the assigned modulation gates.

Preferably, the read-out device has two transfer gates on the upper side of the substrate, wherein each is assigned to a storage gate and serves for the intermittent transfer of the accumulated charge carriers at the storage gates to an associated floating diffusion.

Preferably, the read-out device has two floating diffusions on the upper side of the substrate, in particular, as n+type doped material, which are respectively assigned to a transfer gate and serve to acquire the charge carriers transferred from the transfer gates and supply them as a voltage to an AD converter.

According to the present invention, the separation device may also be designed for separation into three or more charge carrier streams. Accordingly, the memory device comprises three or more memories, while the separation device separates into three or more different time periods. Accordingly, three or more modulation gates, storage gates, transfer gates and floating diffusions are accordingly provided.

A very effective demodulation pixel may be formed by these arrangements.

Further features of the present invention are given in the drawing. The advantages mentioned in each case may also be obtained for feature combinations in whose context they are not mentioned.

BRIEF DESCRIPTION OF THE DRAWING

An exemplary embodiment of the present invention is illustrated by way of example in the drawing and is explained in more detail below:

FIG. 1 shows a pixel of the inventive image sensor.

DETAILED DESCRIPTION OF THE INVENTION

FIG. 1 shows a pixel 10 of the image sensor in the schematic side section.

The pixel 10 of the image sensor has an approximately 50 μm thick n-type doped float zone silicon semiconductor substrate 21 with a specific electrical surface resistance of greater than or equal to 2000 ohm cm. A driftgate 31 is arranged on the surface of the semiconductor substrate above a non-conductive SiO separation layer 77, while a modulation gate 32, a storage gate 41, a transfer gate 51, and a floating diffusion 52 within the substrate, are arranged on both sides of the substrate in a symmetrical arrangement.

The appropriate layers and contacts are not shown. A shutter 80 is arranged between the gates and the transparent back contact to shade the storage gates, transfer gates and the floating diffusion together with the semiconductor substrate lying under the respective gates opposite the incident reflected radiation 90, wherein the shutter 80 comprises an aperture opening 81 in the region below the driftgate. The semiconductor substrate is at least below the driftgate, in particular depleted overall. The driftgate is charged with a positive potential and forms a space charge zone in the semiconductor substrate.

The separation device 30 comprises the driftgate 31 and the modulation gates 32.

The memory device 40 comprises the storage gates 41. The readout device 50 comprises the transfer gates 51, the separation layer 77, the floating diffusion 52, the shutter 80, the aperture opening 81, and the substrate between the aperture and the gates, which is of the same type as the semiconductor substrate 21 in the conversion region 20. The conversion region 20 comprises the semiconductor substrate 21, the back electrode 22, and the shutter 80. The substrate has a thickness of approximately 50 μm.

The reflected IR radiation 90 penetrating the transparent back electrode 22 into the semiconductor substrate 21 under the driftgate induces electron hole pairs 24 in the semiconductor substrate 2421. The photoelectrons are attracted to the driftgate through the space charge zone formed by the driftgate 31. The driftgate has a potential of about 4V. The number of photoelectrons 25 attracted is proportional to the received radiation intensity.

The modulation gates 32 may be supplied with a modulated potential whose maximum lies between the potentials of the driftgate 31 and the storage gate 41 and whose minimum lies below that of the driftgate. The potential of the modulation gate modulates approximately between the values 0 V and 5 V. The two modulation gates are operated with inverse potentials, which means that the potential of the one modulation gate is 0 V when the other is positive and vice versa. Then one modulation gate is always provided with 0 V while the other modulation gate is always provided with 5 V potential. A potential minimum, in this case 0 V, leads to a potential barrier for the photoelectrons under the driftgate so that no photoelectrons can reach the storage gate associated with this modulation gate. A potential maximum, in this case 5 V, leads to an outflow of the photoelectrons under the driftgate past this modulation gate into its associated storage gate.

By the application of the two modulation gates, wherein each has a potential which corresponds to signals respectively inverse to one another, the flow of the photoelectrons generated by the received radiation intensity is correspondingly directed to a switch. The resulting flow of these photoelectrons under the modulation gates corresponds to a multiplication, i.e. a correlation, of the corresponding sinusoidal signals or rectangular signals with the received radiation signal.

The storage gates are charged with a higher potential than the driftgate and alternately and respectively collect the photoelectrons in accordance with the status of the modulation gates. The storage gates have an approximate potential of 10 V. The charges accumulated by the photoelectrons under the storage gates correspond to the correlation values. The correlation values are therefore in the charge domain. The accumulation of the photoelectrons under the corresponding storage gates corresponds to a temporal integration of the above-mentioned correlation of correlation signals and received radiation signals.

For the detection of the photoelectrons accumulated under the storage gates, the potential of the modulation gates is applied at 0 V in order to form a potential barrier for the photoelectrons in the direction of the driftgate. On the other hand, the potential of the transfer gates is raised to an average value, for example 6 V, to allow a conditional outflow of the photoelectrons in the direction of the floating diffusion.

The positive potential of both storage gates of approximately 10 V is now lowered in parallel by means of a time ramp. The resulting changed potential from the sinking positive potential applied to the storage gates and the negative potential of the charge below it, determines whether charge may outflow via the transfer gates. The sinking process is divided into three phases. In a first phase of the time ramp, the said added potential is still more positive for positive storage gates than the constant and equally positive potential of the transfer gates, and no charge flows. In a subsequent second phase of the time ramp, the above-mentioned added potential is more positive for one storage gate and more negative for the other storage gate than the constant and equally positive potential of the transfer gates. As a result, charge flows under the storage gate with the more positive added potential via the assigned transfer gate into the assigned floating diffusion, so that the added potential is again equal to the potential of the corresponding transfer gate. In a final third phase of the time ramp, the said added potentials of both storage gates are higher than the constantly equal potentials. As a result, charges flow under both storage gates into the respectively assigned floating diffusion via the respectively assigned transfer gate.

The charge quantity of the one charged floating diffusion is now converted into a corresponding voltage using source follower and processed further.

The construction of a pixel of the image sensor according to the invention is described, for example, in the applicant's international patent application PCT/EP2016/051296.

LIST OF REFERENCED NUMERALS

10 Pixels of the image sensor
11 Border
20 Conversion range

21 Semiconductor substrate
22 Back electrode
24 Electron hole pairs
25 Photo-electrons
30 Separation device
31 Driftgate
32 Modulation gate
40 Memory device
41 Storage gate
50 Read-out device
51 Transfer gate
52 Floating diffusion
77 Separation layer
80 Shutter
81 Aperture opening
90 Incident radiation

The invention claimed is:

1. An image sensor with a matrix of pixels to produce a resulting image with a higher dynamic range from them acquisition of two original images, wherein the pixels of the image sensor are in the form of demodulation pixels with respectively a conversion region for the generation of charge carriers from the received radiation,
  a separation device for the temporal separation of the generated charge carriers into two charge carrier streams,
  a memory device with two memories for separately storing the charge carriers of the two charge carrier streams, and
  a read-out device for converting the stored charge carriers into electrical signals,
  wherein
  the separation device, the memory device and the read-out device are arranged on one outer surface of a doped substrate, with the conversion re ion comprising the substrate, a back electrode on another outer surface of the substrate, which is opposite to the one outer surface of the substrate, and a shutter that is arranged within the substrate at a distance below the separation device, the memory device and the read-out device so as to have a portion of the substrate interposed between the respective devices and the shutter,
  the shutter comprises an aperture opening in a region below the separation device that allows the separation device to receive incident radiation from the back electrode side of the substrate while shading the memory device and the read-out device from the incident radiation, and
  the separation device is designed, to carry out the separation of the charge carriers generated in one period into two different periods of time.

2. The image sensor according to claim 1, wherein the two periods of time are successively arranged in one piece.

3. The image sensor according to claim 1, wherein the two periods of time are respectively separated and alternately arranged.

4. The image sensor according to claim 1, wherein the separation is performed periodically.

5. The image sensor according to claim 1, further comprising a selection device to select one of the two memories or a value thereof as a function of the degree of saturation of one or both memories and thus to calculate a value for a pixel point in the resulting image.

6. The image sensor according to claim 5, wherein the selection device comprises an analog comparator per pixel or per pixel row, which performs the selection analogously before an AD conversion.

7. The image sensor according to claim 6, wherein the analog comparator comprises an adjustable comparator threshold as a function of which the selection is carried out.

8. The image sensor according to claim 1, wherein the conversion region comprises:
  the substrate with the back electrode for depletion of the substrate on an underside of the substrate,
  wherein the separation device comprises a driftgate on an upper side of the substrate to attract the charge carriers from the conversion region into the separation device, two modulation gates on the upper side of the substrate, which are located on opposite sides of the driftgate, for alternately steering and separating the charge carriers, and the memory device comprises two storage gates on the upper side of the substrate, wherein each storage gate is assigned a modulation gate for collection and storage of the charge carriers directed towards the assigned modulation gates, wherein the read-out device comprises two transfer gates on the upper side of the substrate respectively assigned to a storage gate for the intermittent transfer of the charge carriers collected at the storage gates to an assigned floating diffusion, such that two floating diffusions are on the upper side of the substrate, and wherein each floating diffusion is assigned to a transfer gate to acquire the charge carriers transmitted by the transfer gates and to feed them as voltage into an AD converter.

9. The image sensor according to claim 8, wherein the substrate is an n– type doped semiconductor substrate.

10. The image sensor according to claim 8, wherein the back electrode for depletion of the substrate is a transparent back electrode.

11. The image sensor according to claim 8, wherein the two floating diffusions comprise an n+type doped material.

* * * * *

UNITED STATES PATENT AND TRADEMARK OFFICE
CERTIFICATE OF CORRECTION

PATENT NO. : 10,148,892 B2
APPLICATION NO. : 15/433222
DATED : December 4, 2018
INVENTOR(S) : Beat De Coi It is certified that error appears in the above-identified patent and that said Letters Patent is hereby corrected as shown below:

On the Title Page

Item (56), Other Publications:
Please add: "European Office Action (Application No. 17164857.9) dated July 6, 2017."

Signed and Sealed this
Thirtieth Day of July, 2019

Andrei Iancu
*Director of the United States Patent and Trademark Office*